(12) United States Patent
Hatasawa

(10) Patent No.: US 10,115,693 B2
(45) Date of Patent: Oct. 30, 2018

(54) SOLDER LAYER OF A SEMICONDUCTOR CHIP ARRANGED WITHIN RECESSES

(71) Applicant: PS4 Luxco S.a.r.l., Luxembourg (LU)

(72) Inventor: Akihiko Hatasawa, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 0 days.

(21) Appl. No.: 14/775,112

(22) PCT Filed: Mar. 12, 2014

(86) PCT No.: PCT/JP2014/056517
§ 371 (c)(1),
(2) Date: Sep. 11, 2015

(87) PCT Pub. No.: WO2014/142178
PCT Pub. Date: Sep. 18, 2014

(65) Prior Publication Data
US 2016/0027755 A1   Jan. 28, 2016

(30) Foreign Application Priority Data
Mar. 14, 2013 (JP) ................. 2013-051849

(51) Int. Cl.
*H01L 23/04* (2006.01)
*H01L 23/00* (2006.01)
(Continued)

(52) U.S. Cl.
CPC .......... *H01L 24/17* (2013.01); *H01L 23/3135* (2013.01); *H01L 23/481* (2013.01); *H01L 24/97* (2013.01); *H01L 25/065* (2013.01); *H01L 25/0657* (2013.01); *H01L 25/07* (2013.01); *H01L 25/50* (2013.01); *H01L 21/561* (2013.01); *H01L 21/568* (2013.01);
(Continued)

(58) Field of Classification Search
CPC ............... H01L 23/481; H01L 25/0657; H01L 2225/0653; H01L 2225/06541; H01L 2225/06544; H01L 2225/06548
USPC ................................. 257/686, 698, 774, 775
See application file for complete search history.

(56) References Cited

U.S. PATENT DOCUMENTS 6,294,837 B1 * 9/2001 Akram .................. H01L 21/486
257/698
2004/0172813 A1   9/2004 Matsui
(Continued)

FOREIGN PATENT DOCUMENTS

JP   2000150701 A * 5/2000 .......... H01L 21/486
JP   2007053149      3/2007
JP   2011243724 A   12/2011

OTHER PUBLICATIONS

Application No. PCT/JP2014/056517, International Search Report, dated Jun. 17, 2014.

*Primary Examiner* — Matthew E Warren
(74) *Attorney, Agent, or Firm* — Kunzler, PC

(57) ABSTRACT

One semiconductor chip includes a substrate having insulation properties, a plurality of bump electrodes provided on one surface of the substrate, a plurality of recesses provided in the other surface of the substrate, and a solder layer disposed within the recesses. The recesses are formed such that the area of the opening decreases from the other surface side toward the one surface side of the substrate.

5 Claims, 9 Drawing Sheets

(51) Int. Cl.

| | |
|---|---|
| *H01L 25/065* | (2006.01) |
| *H01L 25/00* | (2006.01) |
| *H01L 23/48* | (2006.01) |
| *H01L 25/07* | (2006.01) |
| H01L 25/18 | (2006.01) |
| H01L 23/31 | (2006.01) |
| H01L 21/56 | (2006.01) |

(52) U.S. Cl.
CPC .......... *H01L 23/3128* (2013.01); *H01L 25/18* (2013.01); *H01L 2224/05556* (2013.01); *H01L 2224/05571* (2013.01); *H01L 2224/06181* (2013.01); *H01L 2224/16145* (2013.01); *H01L 2224/16146* (2013.01); *H01L 2224/16147* (2013.01); *H01L 2224/16225* (2013.01); *H01L 2224/32145* (2013.01); *H01L 2224/32225* (2013.01); *H01L 2224/73204* (2013.01); *H01L 2224/81191* (2013.01); *H01L 2225/06513* (2013.01); *H01L 2225/06517* (2013.01); *H01L 2225/06541* (2013.01); *H01L 2225/06544* (2013.01); *H01L 2924/15311* (2013.01); *H01L 2924/181* (2013.01); *H01L 2924/351* (2013.01)

(56) References Cited

U.S. PATENT DOCUMENTS

| | | | |
|---|---|---|---|
| 2006/0046463 A1* | 3/2006 | Watkins | ............ H01L 21/76898 438/622 |
| 2011/0092065 A1 | 4/2011 | Yoshida et al. | |
| 2011/0097853 A1 | 4/2011 | Kim et al. | |
| 2011/0165731 A1 | 7/2011 | Gerber et al. | |
| 2012/0135565 A1 | 5/2012 | Yamato | |

\* cited by examiner

[Fig. 1]
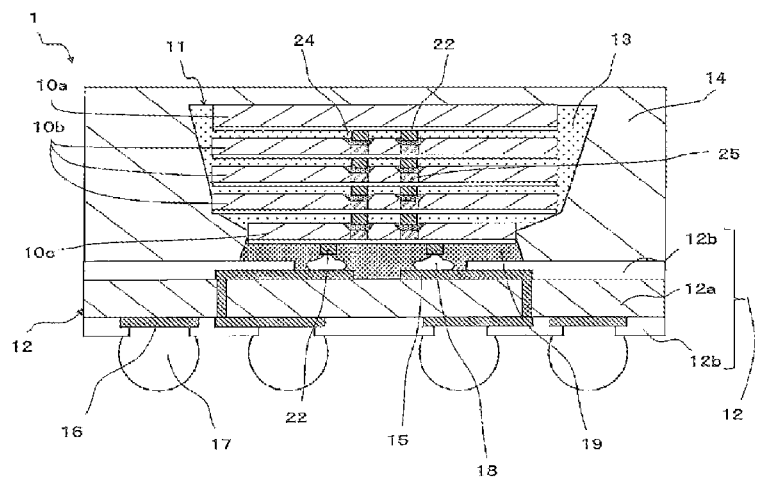
[Fig. 2a]
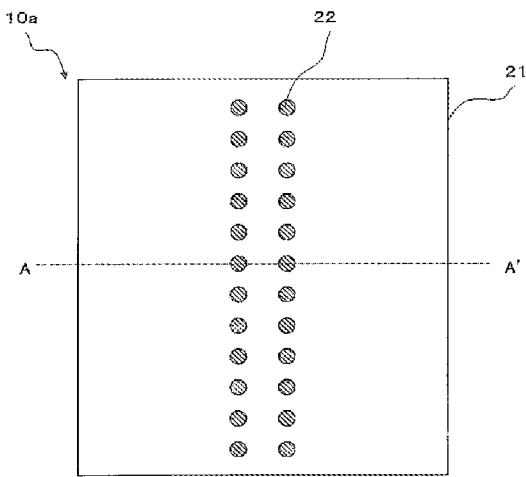

[Fig. 2b]
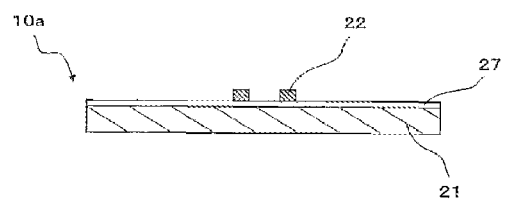
[Fig. 3a]
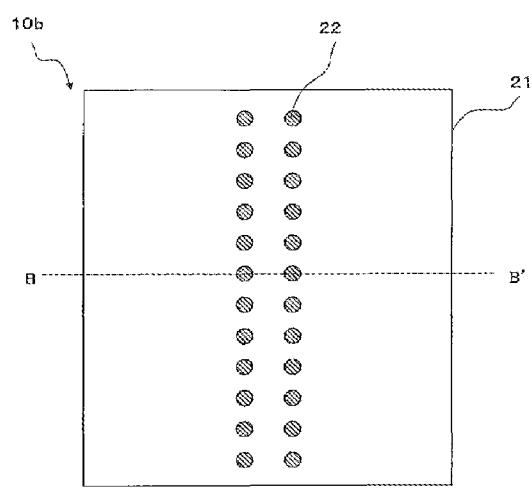
[Fig. 3b]
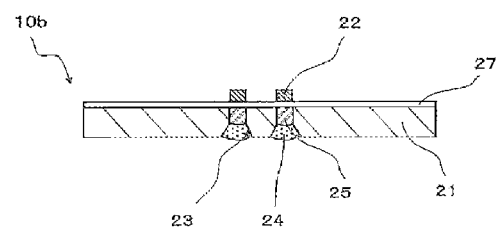

[Fig. 4a]
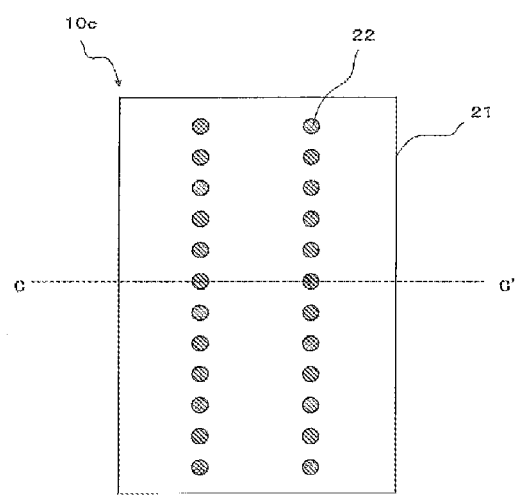
[Fig. 4b]
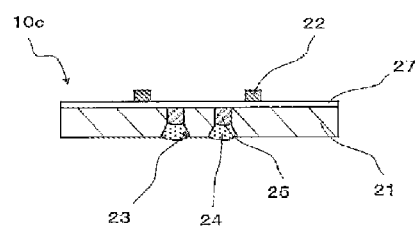

[Fig. 5]
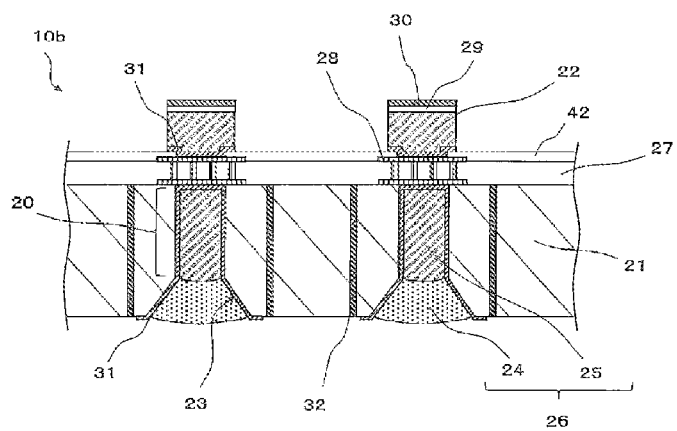
[Fig. 6a]
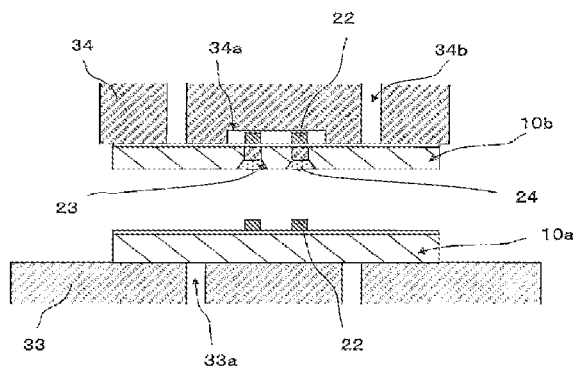

[Fig. 6b]
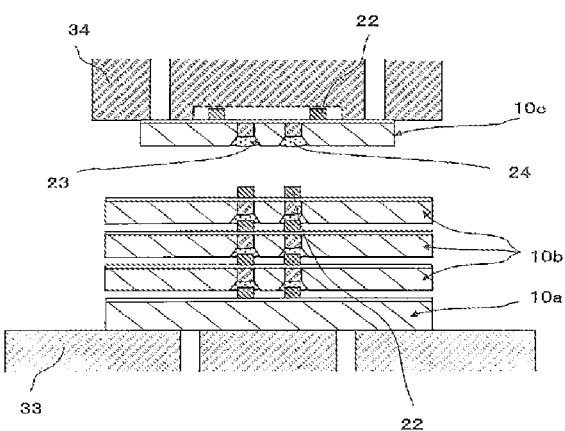
[Fig. 6c]
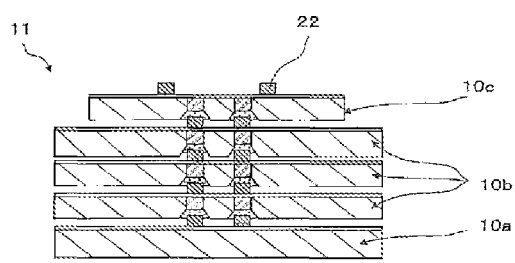

[Fig. 7a]
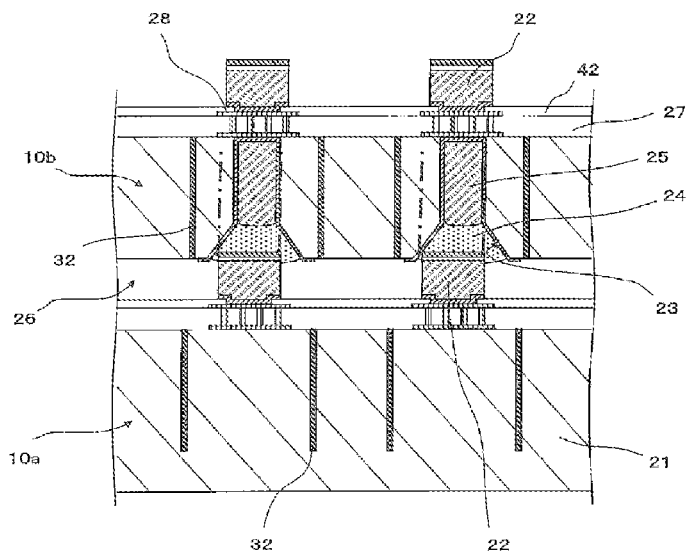
[Fig. 7b]
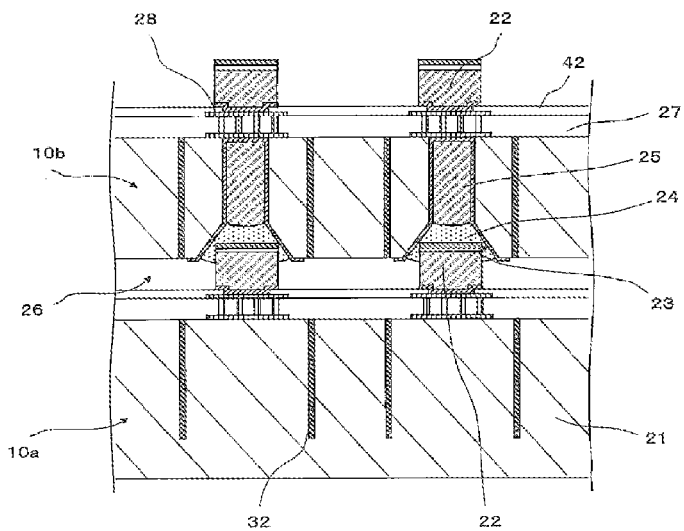

[Fig. 8a]
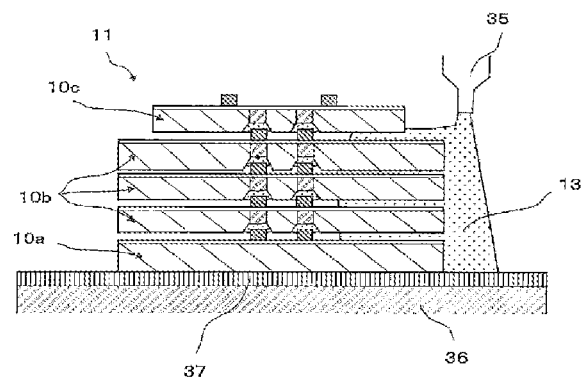
[Fig. 8b]
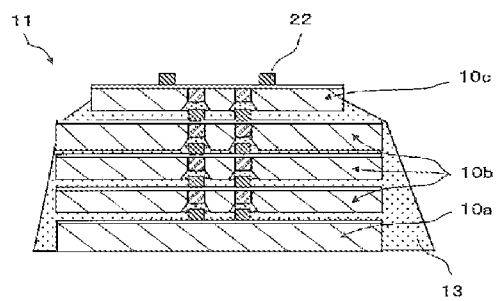
[Fig. 9a]
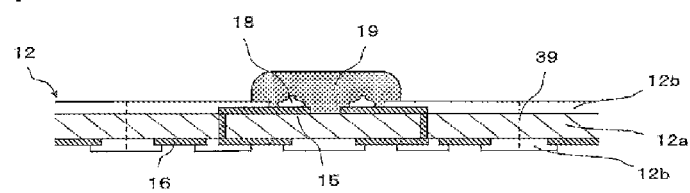
[Fig. 9b]
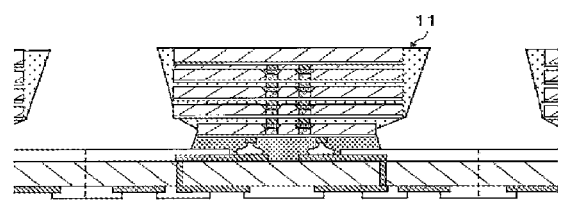

[Fig. 9c]
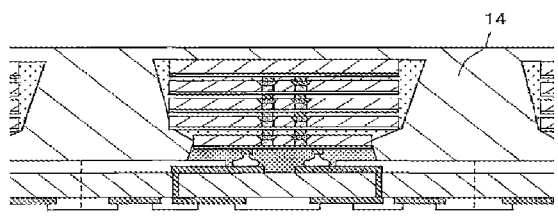
[Fig. 9d]
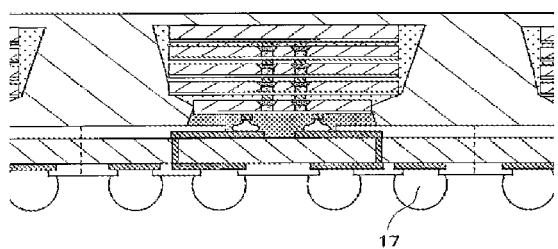
[Fig. 9e]
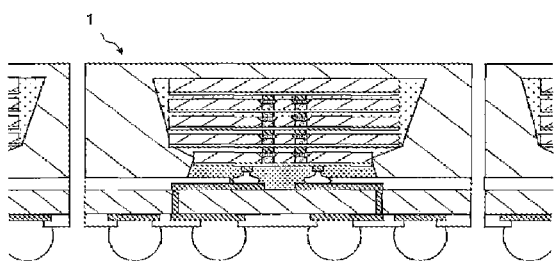

[Fig. 10]
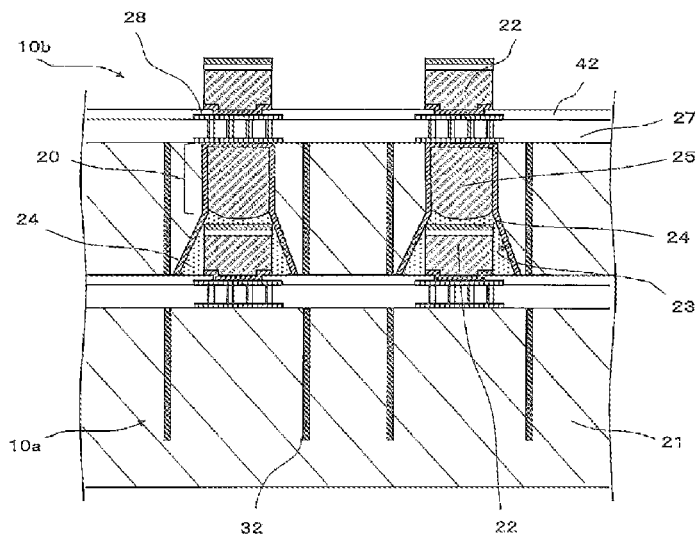
[Fig. 11]
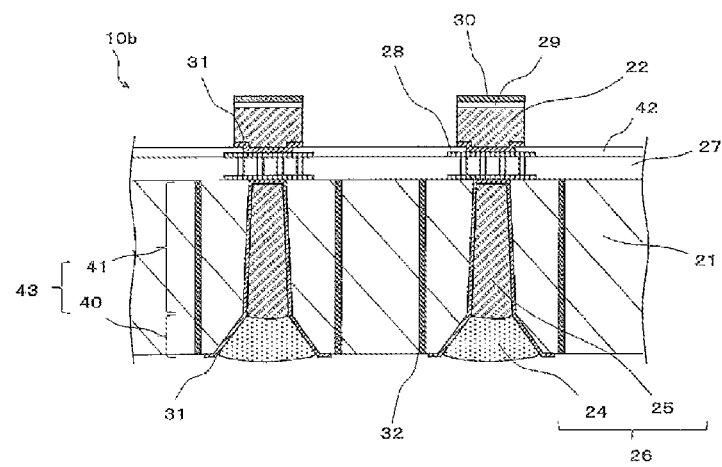

SOLDER LAYER OF A SEMICONDUCTOR CHIP ARRANGED WITHIN RECESSES

TECHNICAL FIELD

The present invention relates to semiconductor chips employed for CoC (chip on chip) constructions and to a semiconductor device of the CoC type having such a semiconductor chip.

BACKGROUND

In recent years, with miniaturization and increased functionality of electronic equipment, CoC-type semiconductor devices are being provided in which a plurality of semiconductor chips provided with electrodes are laminated.

As an example of such a semiconductor device, Patent Reference 1 (Laid-open Japanese Patent Application 2010-251347) discloses a method of forming a semiconductor device by laminating semiconductor chips provided with electrodes, and fixing such a laminated chip structure on a wiring substrate, connecting corresponding bump electrodes to form a laminated chip structure. In the laminated chip structure, the spaces between these semiconductor chips are packed with an under-fill material (sealing resin) that covers the spaces between the laminated semiconductor chips and the periphery of the semiconductor chips, so as to prevent disconnection of the connections between corresponding electrodes or to prevent generation of cracks in the semiconductor chips themselves due to heat stress.

Also, Patent Reference 2 (Laid-open Japanese Patent Application 2005-277059) discloses a semiconductor device constituted by laminating a plurality of semiconductor chips having coupling faces with surface bump electrodes (surface-side contact members) in recesses (back face-side connection members) sunken from the back face thereof. Due to the provision of bonding faces in the sunken recesses, when the semiconductor chip is held by the bonding tool, there is no contact between the surface of the bonding tool and the bonding face. Even if the bonding face is crushed by pressure applied by the bonding tool, it does not readily come into contact with for example adjacent wiring. In this way, short-circuiting is unlikely, since the bonding face does not easily come into contact with adjacent wiring or the like even if the bonding face is crushed.

PATENT REFERENCES

Patent Reference 1: Laid-open Japanese Patent Application 2010-251347

Patent Reference 2: Laid-open Japanese Patent Application 2005-277059

OUTLINE OF THE INVENTION

Problem that the Invention is Intended to Solve

In a CoC type semiconductor device, a plurality of semiconductor chips are laminated in such a way that corresponding electrodes of each of the semiconductor chips are in contact, with interposition of a solder layer, when the chip laminated structure is formed. However, since the laminated semiconductor chip electrodes are respectively constituted by substantially flat surfaces, when even a little force is applied thereto in the planar direction of the semiconductor chip when applying pressure when fixing the corresponding electrodes of the semiconductor chips, these corresponding electrodes suffer positional misalignment due to slippage of the corresponding electrodes on either side of the solder layer with respect to each other. Consequently, there is a risk that secure fixing of the corresponding electrodes may not be achieved.

In the method of manufacture of a semiconductor device disclosed in Patent Reference 1, when the chip laminated structure is formed, slippage between corresponding electrodes cannot be suppressed. Consequently, in the step of hardening the solder layer by applying pressure and heat, the semiconductor chips, which are arranged on either side of the solder layer, tend to undergo slippage, resulting in positional misalignment between the semiconductor chips in the direction of the plane of the chip.

In the semiconductor device disclosed in Patent Reference 2, the recesses are formed with a larger size than the external shape of the surface bump electrodes, so a gap is produced between the surface bump electrodes and the side faces of the recesses. Consequently, when the adjacent semiconductor chips are bonded, variability occurs in the positions at which the surface bump electrodes are fixed within the recesses. As a result, the problem arises that positional misalignment in the direction of the plane of the semiconductor chip occurs when the adjacent semiconductor chips are connected.

An object of the present invention is to provide semiconductor chips having a construction such that positional misalignment of adjacent semiconductor chips in the direction of the plane of the semiconductor chips when a plurality of such semiconductor chips are laminated to form a laminated chip structure cannot easily occur, and a semiconductor device having such semiconductor chips.

Means for Solving the Problem

In order to achieve the aforementioned object, a semiconductor chip according to the present invention comprises: an insulating substrate; a plurality of bump electrodes provided on one face side of the substrate; a plurality of recesses provided in the other face side of the substrate; and a solder layer provided within the recesses. A characteriztic feature is that the recesses are formed in such a way that the aperture area thereof becomes smaller in the direction from the other face side of the substrate towards the one face side thereof.

Beneficial Effect of the Invention

According to the present invention, by providing recesses in the other face side of the semiconductor chip, when a plurality of semiconductor chips are laminated, the surface bump electrodes are accommodated so as to be covered by the solder layer in the recesses, so positional misalignment in the direction of the plane of the semiconductor chips cannot easily occur. In addition, by forming these recesses so that the aperture area thereof becomes smaller in the direction from the other face side of the substrate towards the one face side thereof, arrangement of the surface bump electrodes in the middle of the recesses is facilitated, so positional misalignment in the direction of the plane of the semiconductor chips cannot readily occur.

BRIEF DESCRIPTION OF THE DRAWINGS

FIG. 1 This is a cross-sectional view showing a semiconductor device having semiconductor chips according to a first embodiment of the present invention.

FIG. 2a This is a plan view showing a first semiconductor chip according to the present invention.

FIG. 2b This is a cross-sectional view along the line A-A' of FIG. 2a.

FIG. 3a This is a plan view showing a second semiconductor chip according to a first embodiment.

FIG. 3b This is a cross-sectional view along the line B-B' of FIG. 3a.

FIG. 4a This is a plan view showing a third semiconductor chip according to the first embodiment.

FIG. 4b This is a cross-sectional view along the line C-C' of FIG. 4a.

FIG. 5 This is a cross-sectional view to a larger scale showing the vicinity of a surface bump electrode of a second semiconductor chip of the first embodiment.

FIG. 6a This is a cross-sectional view showing the step of forming a laminated chip structure by laminating semiconductor chips according to the first embodiment.

FIG. 6b This is a cross-sectional view showing a step of forming a laminated chip structure by laminating semiconductor chips according to the first embodiment.

FIG. 6c This is a cross-sectional view showing a step of forming a laminated chip structure by laminating semiconductor chips according to the first embodiment.

FIG. 7a This is a cross-sectional view showing a process whereby lamination is effected while suppressing positional misalignment when the semiconductor chips of the first embodiment are laminated.

FIG. 7b This is a cross-sectional view showing a process whereby lamination is effected while suppressing positional misalignment when the semiconductor chips of the first embodiment are laminated.

FIG. 8a This is a cross-sectional view showing a step of packing a laminated chip structure produced by laminating the semiconductor chips according to the first embodiment with under-fill material.

FIG. 8b This is a cross-sectional view showing a step of packing a laminated chip structure produced by laminating the semiconductor chips according to the first embodiment with under-fill material.

FIG. 9a This is a cross-sectional view showing a step of forming a semiconductor device comprising a semiconductor chip according to the first embodiment.

FIG. 9b This is a cross-sectional view showing a step of forming a semiconductor device comprising a semiconductor chip according to the first embodiment.

FIG. 9c This is a cross-sectional view showing a step of forming a semiconductor device comprising a semiconductor chip according to the first embodiment.

FIG. 9d This is a cross-sectional view showing a step of forming a semiconductor device comprising a semiconductor chip according to the first embodiment.

FIG. 9e This is a cross-sectional view showing a step of forming a semiconductor device comprising a semiconductor chip according to the first embodiment.

FIG. 10 This is a cross-sectional view showing the vicinity of a surface bump electrode according to a modified example of a semiconductor chip according to the first embodiment of the present invention.

FIG. 11 This is a cross-sectional view showing the vicinity of a surface bump electrode according to a modified example of a semiconductor chip according to the second embodiment of the present invention.

EMBODIMENTS OF THE INVENTION

Embodiments of the present invention are described below with reference to the drawings.

First Embodiment

FIG. 1 is a cross-sectional view showing a semiconductor device constructed using semiconductor chips according to a first embodiment of the present invention.

In a semiconductor device 1 according to the present invention, a laminated chip structure 11 comprising a single first semiconductor chip 10a, three second semiconductor chips 10b, and a single third semiconductor chip 10c is mounted in such a way that one face side of the third semiconductor chip 10c faces one face side of a wiring substrate 12. An under-fill material 13 is packed into the gap between adjacent semiconductor chips 10 of the laminated chip structure 11. An adhesive member 19 is packed between the third semiconductor chip 10c and the wiring substrate 12. The periphery of the laminated chip structure 11 is covered with sealing resin 14.

The construction of the semiconductor device 1 is described in detail below.

The wiring substrate 12 comprises a rectangular insulating substrate 12a (for example a glass epoxy substrate) formed with wiring, not shown, on both faces. Both wirings are covered by an insulating film 12b (for example a solder resist film), with the exception of connecting pads 15 or lands 16, to be described. A plurality of the connecting pads 15 that are connected with the third semiconductor chip 10c through wire bumps 18 are formed on one face side of the wiring substrate 12. On the other face side of the wiring substrate 12, a plurality of the lands 16 that are connected with solder balls 17 constituting external terminals are formed, at prescribed intervals. The connecting pads 15 and the lands 16 are electrically connected by wiring formed on the insulating substrate 12a.

The laminated chip structure 11 is mounted on one face side of the wiring substrate 12 in such a way that the connecting pads 15 formed on one face side of the wiring substrate 12 and the surface bump electrodes 22 (bump electrodes) of one face side of the third semiconductor chip 10c of the laminated chip structure 11 are electrically connected through the wire bumps 18. The laminated chip structure 11 has a construction constituted by laminating a single third semiconductor chip 10c, three second semiconductor chips 10b, and a single first semiconductor chip 10a, referring to the order in which these are laminated on the wiring substrate 12. The second semiconductor chips 10b are laminated on the third semiconductor chip 10c in such a way that the surface bump electrodes 22 on one face side of the second semiconductor chip 10b are connected with semiconductor layers 24 within recesses 23 on the other face side of the third semiconductor chip 10c. Adjacent second semiconductor chips 10b are laminated in such a way that the surface bump electrodes 22 on one face side of the second semiconductor chip 10b that is in the second place is connected with the semiconductor layers 24 within the recesses 23 on the other face side of the second semiconductor chip 10b that is in the first place. Also, the second semiconductor chip 10b that is in the third place is likewise laminated with the second semiconductor chip 10b that is in the second place. The second semiconductor chip 10b that is in the third place and the first semiconductor chip 10a are laminated in such a way that the surface bump electrodes 22 on the one face side of the first semiconductor chip 10a are connected with the semiconductor layers 24 within the recesses 23 on the other face side of the second semiconductor chip 10b that is in the third place. In this embodiment, a plurality of memory chips and interface chips are employed as the semiconductor chips 10 constituting the laminated chip structure 11.

Under-fill material 13 is packed between adjacent laminated semiconductor chips 10 of the laminated chip structure 11, and at the periphery. An adhesive member 19 made of for example NCP (Nonconductive Paste) is packed between the wiring substrate 12 and the third semiconductor chip 10c of the laminated chip structure 11. Sealing resin 14 is formed so as to cover the periphery of the laminated chip structure 11 that is mounted on the one face side of the wiring substrate 12. The sealing resin 14 is formed in the same range as the wiring substrate 12, seen in plan view.

FIGS. 2a and 2b are views showing a first semiconductor chip 10a constituting the laminated chip structure 11. The first semiconductor chip 10a is constituted by a rectangular silicon substrate 21 (substrate); a circuit forming layer 27 and an insulating protective film, not shown, are provided on the entire surface on the one face side of the silicon substrate 21. Also, a plurality of surface bump electrodes 22 are formed so as to constitute a row parallel with one side of the silicon substrate 21, in the central region on one face side of the silicon substrate 21.

FIG. 3a and FIG. 3b are views showing a second semiconductor chip 10b constituting the laminated chip structure 11. The second semiconductor chips 10b are constituted by a rectangular silicon substrate 21 of the same size as the first semiconductor chip 10a and are provided with a circuit forming layer 27 and insulating protective film 42 (see FIG. 5) over the entire surface, on the one face side of the silicon substrate 21. Also, a plurality of surface bump electrodes 22 are formed so as to constitute a row parallel with one side of the silicon substrate 21, in a central region on the one face side of the silicon substrate 21. On the other face side of the silicon substrate 21, a plurality of cone-shaped recesses 23 from the other face side of the silicon substrate 21 towards the one face side thereof are formed in the central region of the silicon substrate 21 so as to constitute a row parallel with the row of the surface bump electrodes 22 on the one face side of the silicon substrate 21 and with one side of the silicon substrate 21. These recesses 23 are provided directly below the surface bump electrodes 22 that are formed on the one face side of the silicon substrate 21, and within these there is provided a conductive solder layer 24 made for example of Sn/Ag solder. Also, a conductive conductor layer 25 made for example of Cu is accommodated within a linkage section that passes through from the recesses 23 towards the one face side of the silicon substrate 21, with fixed aperture area.

FIG. 5 is a cross-sectional view to a larger scale showing the construction at the periphery of the surface bump electrodes 22 of a second semiconductor chip 10b. The surface bump electrode 22 is made of for example Cu and is formed in a cylindrical pillar shape and is arranged so as to project from the one face side of the silicon substrate 21. A Ni-plated layer 29 for prevention of Cu diffusion and an Au-plated layer 30 for prevention of oxidation are formed on the surface bump electrode 22. The surface bump electrode 22 and the solder layer 24 within the recess 23 are electrically connected through an electrode pad 28 and the conductive layer 25 that is accommodated in the linkage section 20.

FIGS. 4a and 4b are views showing the third semiconductor chip 10c constituting the laminated chip structure 11. The third semiconductor chip 10c is constituted by a rectangular silicon substrate 21 that is smaller in plan view than the first semiconductor chip 10a. An insulating protective film, not shown, and a circuit forming layer 27 are formed over the entire surface on the one face side of the silicon substrate 21. Also, the plurality of surface bump electrodes 22 are formed so as to constitute a row parallel with one side of the silicon substrate 21, at a position offset towards the edge of the one face side of the silicon substrate 21, compared with the position where the surface bump electrodes 22 are provided on the one face side of the second semiconductor chips 10b. On the other face side of the silicon substrate 21, a plurality of cone-shaped recesses 23 are formed, from the other face side of the silicon substrate 21 towards the one face side thereof, in a central region of the silicon substrate 21, so as to constitute a row parallel with the row of surface bump electrodes 22 on the one face side of the silicon substrate 21 and one side of the silicon substrate 21. These recesses 23 are formed in positions offset towards the edge side of the silicon substrate 21, from directly below the position where the surface bump electrodes 22 are formed on the one face side of the silicon substrate 21. In addition, a conductive solder layer 24 made for example of Sn/Ag solder is provided within the recesses 23. Also, a conductive conductor layer 25 made for example of Cu is accommodated in a linkage section 20 that passes through from the recesses 23 towards the one face side of the silicon substrate 21, with fixed aperture area. The surface bump electrodes 22 and the solder layer 24 of the recesses 23 are electrically connected through the conductive layer 25 accommodated in the linkage section 20 and the circuit forming layer 27.

Next, the step of manufacturing a semiconductor device 1 having the construction described above will be described with reference to FIGS. 6a to 9e.

First of all, as shown in FIG. 6a, in order to form the laminated chip structure 11, a first semiconductor chip 10a is arranged on a bonding stage 33 having a plurality of suction holes 33a, so as to bring this bonding stage into contact with the other face side of the first semiconductor chip 10a. This first semiconductor chip 10a that has thus been arranged is held on the bonding stage 33 by negative pressure generated in the suction holes 33a.

While the second semiconductor chips 10b are held on the bonding tool 34 by negative pressure generated in the suction holes 34a of the bonding tool 34, the bonding tool 34 shifts a second semiconductor chip 10b to directly above the bonding stage 33. Thus the second semiconductor chip 10b is laminated on the first semiconductor chip 10a in such a way that the surface bump electrodes 22 of the first semiconductor chip 10a are connected with the solder layers 24 in the recesses 23 of the second semiconductor chips 10b. By the same procedure, the second semiconductor chips 10b that are in second place and third place are laminated on the second semiconductor chip 10b that is in the first place. It should be noted that, at this time-point, the solder layer 24 has not yet hardened, and so has fluidity.

At this point, as shown in FIG. 7a, if the semiconductor chips 10 are laminated in a condition in which the surface bump electrodes 22 of the semiconductor chip positioned at the bottom are not arranged in the middle of the recesses 23 of the semiconductor chip positioned at the top, a condition in which the semiconductor chips 10 are positionally offset in the direction of their plane is initially produced. However, by making the recesses 23 of the semiconductor chips 10 of this embodiment cone-shaped, in the step in which the semiconductor chips 10 are made to approach each other more closely, as shown in FIG. 7b, the surface bump electrodes 22 slide along the slopes of the recesses 23, so that they tend to be accommodated in the middle of the recesses 23. Consequently, when the semiconductor chips 10 are laminated, positional offset in the planar direction of the semiconductor chips 10 does not readily occur.

Next, the third semiconductor chip 10c is laminated as shown in FIG. 6b. The third semiconductor chip 10c is moved to directly above the bonding stage 33 by the bonding tool 34, while this third semiconductor chip 10c is held by the bonding tool 34 by the negative pressure generated in the suction holes 34b. Then, the third semiconductor chip 10c is laminated on the second semiconductor chip 10b that is in third place, in such a way that the surface bump electrodes 22 of the second semiconductor chip 10b that is in third place and the solder layer 24 in the recesses 23 of the third semiconductor chip 10b are brought into contact. Once all the semiconductor chips 10 have been laminated, the respective solder layers 24 of the semiconductor chips 10 are hardened.

The laminated chip structure 11 is formed by laminating the plurality of semiconductor chips 10 as described above.

As shown in FIG. 8a, the laminated chip structure 11 that has thus been formed is arranged on a coating stage 36 that is covered with a coating sheet 37 on one face side thereof and under-fill material 13 is then packed into the gap 26 (see FIG. 7a, 7b) of the laminated chip structure 11 by means of a dispenser 35. A material such as a fluorine-based sheet or sheet coated with a silicon-based adhesive of low wettability with respect to the under-fill material may be employed for the coating sheet 37. The laminated chip structure 11 packed with under-fill material 13 as shown in FIG. 8b is then formed by hardening the under-fill material by heat treatment of the entire laminated chip structure 11 at a prescribed temperature such as for example about 150° C. In this embodiment, since a sheet made of material of low wettability with respect to the under-fill material 13 is employed for the coating sheet 37, the under-fill material 13 does not readily adhere to the coating sheet 37 when the under-fill material is hardened.

Next, the wiring substrate 12 is prepared as shown in FIG. 9a. As the wiring substrate 12, an insulating substrate 12a that is formed with wiring, not shown, on both faces thereof (for example a glass epoxy substrate) is employed. On the one face side of the insulating substrate 12a, there are formed a plurality of connecting pads 15 and wire bumps 18, provided on the surface of the connecting pads 15, for connecting with the third semiconductor chip 10c. On the other face side of the semiconductor substrate 12a, a plurality of lands 16 connected with the solder balls 17 constituting the outside terminals are formed with a prescribed gap, for example in lattice fashion. The plurality of connecting pads 15 and the plurality of lands 16 are electrically connected by conductive material passing through the insulating substrate 12a. The respective wirings on the two faces of the insulating substrate 12a are covered by an insulating film 12b made for example of solder resist, with the exception of the connecting pads 15 and the lands 16. Also, the wiring substrate 12 is partitioned by dicing lines 39 into regions destined to constitute semiconductor devices 1.

One face side of the wiring substrate 12 is coated with adhesive material 19, such as for example NCP, prior to hardening, so as to cover the connecting pads 15 and wire bumps 18. Prior to hardening of the coating of adhesive member 19, as shown in FIG. 9b, the laminated chip structure 11 is laminated onto the wiring substrate 12 in such a way that the one face of the wiring substrate 12 and the one face of the third semiconductor chip 10c of the laminated chip structure 11 face each other. At this point, the wire bumps 18 of the wiring substrate 12 and the surface bump electrodes 22 of the third semiconductor chip 10c of the laminated chip structure 11 are connected. In this way, the first semiconductor chip 10a in the laminated chip structure 11 is arranged in the position that is most remote from the wiring substrate 12, by mounting the laminated chip structure 11 on the one face of the wiring substrate 12.

After mounting the laminated chip structure 11 on the wiring substrate 12, the wiring substrate 12 is set in a metal mould comprising an upper part and lower part of a transfer mould device, not shown, so as to cover the laminated chip structure 11 with sealing resin 14. A cavity, not shown, that covers all of the plurality of semiconductor chips 10 is formed in the upper part of the metal mould and the laminated chip structure 11 is accommodated in this cavity. After this, sealing resin 14, melted by heating, is poured into the cavity, so as to cover the laminated chip structure 11 within the cavity with this sealing resin 14. As the sealing resin 14, for example epoxy resin or the like thermosetting resin may be employed.

Next, in a condition in which the cavity is filled with the sealing resin 14, the sealing resin 14 is hardened at a prescribed temperature (for example about 180° C.). In this way, as shown in FIG. 9c, sealing resin 14 is formed covering the laminated chip structure 11 that is mounted on the one face of the wiring substrate 12. Furthermore, the sealing resin 14 is hardened by baking the sealing resin 14 at a prescribed temperature. In this embodiment, the sealing resin 14 is formed after packing the gap 26 between adjacent semiconductor chips 10 by the under-fill material 13 and the adhesive member 19, so production of voids caused by air present in gaps 26 between the semiconductor chips 10 is suppressed.

After the sealing resin 14 has been formed on the one face of the wiring substrate 12, as shown in FIG. 9d, the lands 16 that are formed on the other face of the wiring substrate 12 are connected with conductive metal balls, such as for example solder balls 17, constituting the outside terminals of the semiconductor device 1. The plurality of solder balls 17 are simultaneously mounted on the lands 16, being suctionally held by a mounting tool, not shown, provided with a plurality of suction holes formed so as to coincide in position with the lands 16 of the wiring substrate 12. Next, the lands 16 and the solder balls 17 are connected by reflow of the entire wiring substrate 12. When the solder balls 17 are connected with the lands 16, as shown in FIG. 9e, a plurality of CoC-type semiconductor devices 1 are formed by cutting and separating the wiring substrate 12 along prescribed dicing lines 39.

While the case where the laminated chip structure 11 employed in the present embodiment was constituted of memory chips and interface chips was described, a construction could be employed employing semiconductor chips other than logic chips or the like, or a silicon interposer.

As described above, owing to the provision of the semiconductor chips 10 constituting the laminated chip structure 11 with cone-shaped recesses 23, when laminating semiconductor chips 10, the surface bump electrodes 22 accommodated in the recesses 23 slide to the centers of the recesses 23 along the slopes of the recesses 23. As a result, connection of the surface bump electrodes 22 at the center of the recesses 23 is facilitated, and positional misalignment of the semiconductor chips 10 in the planar direction of the semiconductor chips 10 becomes unlikely.

Also, the connection strength of the semiconductor chips 10 is increased since the surface bump electrodes 22 and the recesses 23 are connected by covering the entire surface of the surface bump electrodes 22 with a solder layer 24, by providing the solder layer 24 within the recesses.

Furthermore, with the construction of this embodiment, compared with the construction of Patent Reference 1, in which surface bump electrodes 22 are connected that project from one face side of the wiring substrate 12, the gaps 26 between the semiconductor chips 10 can be reduced in size, owing to the adoption of an arrangement wherein the surface bump electrodes 22 are accommodated in the recesses 23. In this way, the semiconductor device 1 can be reduced in thickness.

FIG. 10 is a cross-sectional view to a larger scale showing the construction of the periphery of the surface bump electrodes 22, when the second semiconductor chips 10b and the first semiconductor chip 10a of a modified example of the first embodiment are connected.

The recesses 23 provided on the other face side of the second semiconductor chips 10b are constructed of a size capable of completely accommodating the surface bump electrodes 22 of the first semiconductor chip 10a. Specifically, the depth of the recesses 23 is constituted so as to be greater than the projection height of the surface bump electrodes 22 from the semiconductor chips 10. Such a construction of the recesses 23 is not restricted to the recesses 23 formed on the other face side of the second semiconductor chips 10b but is also applied to the recesses 23 formed on the other face side of the third semiconductor chip 10c.

As described above, since the lamination is effected in such a way that the semiconductor chips 10 adhere tightly to each other, by making the recesses 23 of a size capable of completely accommodating the surface bump electrodes 22 which are accommodated therein, gaps 26 between the semiconductor chips 10 are eliminated. In this way, the semiconductor device 1 as a whole is further reduced in thickness and the need to pack under-fill material 13 between the semiconductor chips disappears, reducing the manufacturing cost of the semiconductor device 1.

Second Embodiment

FIG. 11 is a cross-sectional view to a larger scale showing the construction of the periphery of the surface bump electrodes 22 of the second semiconductor chips 10b according to a second embodiment of the present invention.

The second semiconductor chips 10b according to the present embodiment are provided with through-holes 43 that pass through the silicon substrate 21 from the one face side of the silicon substrate 21 towards the other face side thereof. These through-holes 43 are provided with a first aperture 40 that extends into the interior of the silicon substrate 21 from the other face side of the silicon substrate 21 and a second aperture 41 that is provided between the one face side of the silicon substrate 21 and the first aperture 40.

The first aperture 40, that is provided at the other face side of the silicon substrate 21, is formed in a conical shape with a first reduction ratio whereby the aperture area decreases from the other face side of the silicon substrate 21 towards the one face side thereof. Also, the first aperture 40 is formed in the central region of the silicon substrate 21 on the other face side of the silicon substrate 21 so as to form a row parallel with the row of the surface bump electrodes 22 on the one face side of the silicon substrate 21 and the one side of the silicon substrate 21. A conductive semiconductor layer 24 made for example of Sn/Ag solder is provided in the first aperture 40.

A second aperture 41 that is provided between the first aperture 40 and the one face side of the silicon substrate 21 is formed in conical shape with an aperture area that decreases with a second reduction ratio from the other face side of the silicon substrate 21 towards the one face side thereof. In this second aperture 41 there is accommodated a conductive conductor layer 25 made for example of Cu. In this case, the second reduction ratio, possessed by the second aperture 41, is smaller than the first reduction ratio, possessed by the first aperture 40.

Further details regarding the construction and the method of manufacturing the semiconductor device 1 are the same as in the case of the first embodiment so description thereof is dispensed with.

The same beneficial effects as in the first embodiment are also obtained with the present embodiment.

While various embodiments have been described above with reference to specific constructions of the semiconductor device according to the present invention, the present invention is not restricted to the embodiments described above and various alterations can be made with respect to the embodiments described above within a range not departing from the gist of the present invention. For example, while, in the embodiments described above, a semiconductor chip was described in which the surface bump electrodes were arranged so as to constitute a row in the central region, the present invention could equally well be applied to semiconductor chips in which the surface bump electrodes are arranged in any desired fashion.

What is claimed is:

1. A semiconductor chip comprising:
   a semiconductor substrate;
   a plurality of bump electrodes provided on one face side of said substrate;
   a plurality of recesses provided on the other face side of said substrate;
   a solder layer arranged within said recesses, wherein said recesses are formed so as to have a smaller aperture area from said other face side of said substrate towards said one face side thereof, and wherein the solder layer completely fills said recesses; and
   a circuit forming layer disposed between the solder layer and the plurality of bump electrodes.

2. The semiconductor chip as claimed in claim 1, comprising:
   a linkage section passing through from said recess to said one face side of said substrate and formed in said substrate; and
   a conductor layer being arranged in said linkage section, wherein said bump electrodes and said solder layer are electrically connected through said conductor layer.

3. The semiconductor chip as claimed in claim 1, wherein said recesses are formed in conical shape.

4. The semiconductor chip as claimed in claim 1, wherein said bump electrodes are made of copper.

5. The semiconductor chip as claimed in claim 4, wherein said copper bump electrodes are formed in a cylindrical pillar shape.

* * * * *